United States Patent
Chung et al.

(10) Patent No.: US 9,088,004 B2
(45) Date of Patent: Jul. 21, 2015

(54) ORGANIC LIGHT-EMITTING DISPLAY APPARATUS AND MANUFACTURING METHOD THEREOF

(71) Applicant: Samsung Display Co., Ltd., Yongin, Gyeonggi-Do (KR)

(72) Inventors: Jin-Koo Chung, Yongin (KR); Jun-Ho Choi, Yongin (KR); Kwan-Hyun Cho, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/169,226

(22) Filed: Jan. 31, 2014

(65) Prior Publication Data

US 2015/0028298 A1    Jan. 29, 2015

(30) Foreign Application Priority Data

Jul. 23, 2013    (KR) .......................... 10-2013-0086961

(51) Int. Cl.
*H01L 29/72* (2006.01)
*H01L 51/52* (2006.01)
*H01L 51/56* (2006.01)

(52) U.S. Cl.
CPC ............ *H01L 51/5203* (2013.01); *H01L 51/56* (2013.01)

(58) Field of Classification Search
CPC ........................ H01L 51/0545; H01L 27/1214
USPC ................................................ 257/40; 438/34
See application file for complete search history.

(56) References Cited

U.S. PATENT DOCUMENTS

| 7,265,391 B2 * | 9/2007 | Yamazaki et al. ............ 257/88 |
| 2012/0104422 A1 | 5/2012 | Lee et al. |
| 2012/0313099 A1 | 12/2012 | Chung et al. |

FOREIGN PATENT DOCUMENTS

| KR | 1020120044876 A | 5/2012 |
| KR | 1020120134464 A | 12/2012 |

* cited by examiner

*Primary Examiner* — Edward Wojciechowicz
(74) *Attorney, Agent, or Firm* — Cantor Colburn LLP

(57) ABSTRACT

An organic light-emitting display apparatus includes: a substrate; pixels defined on the substrate, where each pixel includes a first region including a light-emitting region and a second region including a transmission region; a third region defined on the substrate disposed between the pixels; first electrodes disposed in the pixels on the substrate, respectively, where each first electrode is disposed in the first region of a corresponding pixel; an organic emission layer disposed to cover the first electrodes; a first auxiliary layer disposed on the organic emission layer in the second region and which exposes the first region; a second electrode disposed on the organic emission layer in the first region; a second auxiliary layer disposed in the first and second regions and which exposes the third region; and a third electrode disposed in the third region and in contact with the second electrode.

32 Claims, 10 Drawing Sheets

ORGANIC LIGHT-EMITTING DISPLAY APPARATUS AND MANUFACTURING METHOD THEREOF

This application claims priority to Korean Patent Application No. 10-2013-0086961, filed on Jul. 23, 2013, and all the benefits accruing therefrom under 35 U.S.C. §119, the content of which in its entirety is herein incorporated by reference.

BACKGROUND

1. Field

One or more exemplary embodiments of the invention relate to an organic light-emitting display apparatus and a manufacturing method of the organic light-emitting display apparatus.

2. Description of the Related Art

An organic light-emitting display apparatus is a self light-emitting display that electrically excites an organic compound to emit light. Since the organic light-emitting display apparatus may be operated at a low voltage, may be easily formed in a thin profile, and may have wide viewing angles and fast response speeds, the organic light-emitting display apparatus has received attention as an advanced display that may address limitations in a liquid crystal display device.

The organic light-emitting display apparatus may be used as a transparent display apparatus which appears transparent by forming a light transmission part except a region including a thin film transistor or an organic light-emitting device.

When the organic light-emitting display apparatus is used as the transparent display apparatus, transparent/translucent metal may be provided over an entire area of a display area, or opaque metal is patterned to expose the light transmission part to form a cathode, e.g., an upper electrode. When the transparent/translucent metal is used, a large-sized panel may be not be efficiently manufactured due to high sheet resistance of the cathode, and when the opaque metal is used, a fine metal mask, which is typically used in a conventional organic material patterning process to form an opening pattern, may be not be effectively used.

SUMMARY

One or more exemplary embodiments of the invention include an organic light-emitting display apparatus that may easily form a pattern of a cathode as an upper electrode and may reduce resistance, and a manufacturing method of the organic light-emitting display apparatus.

Additional aspects will be set forth in part in the description which follows and, in part, will be apparent from the description, or may be learned by practice of the presented embodiments.

According to one or more exemplary embodiments of the invention, an organic light-emitting display apparatus includes: a substrate; a plurality of pixels defined on the substrate, where each pixel includes a first region including a light-emitting region which emits light, and a second region including a transmission region which transmits external light; a third region defined on the substrate disposed between the pixels; a plurality of first electrodes disposed in the pixels on the substrate, respectively, where each first electrode is disposed in the first region of a corresponding pixel; an organic emission layer disposed to cover the first electrodes; a first auxiliary layer disposed on the organic emission layer in the second region and which exposes the first region; a second electrode disposed on the organic emission layer in the first region; a second auxiliary layer disposed in the first region and the second region and which exposes the third region; and a third electrode disposed in the third region and in contact with the second electrode.

In an exemplary embodiment, the second electrode may expose the second region.

In an exemplary embodiment, the second electrode may be disposed in the second region, and a thickness of a portion of the second electrode disposed in the second region may be less than a thickness of a portion of the second electrode disposed in the first region.

In an exemplary embodiment, the second electrode may be formed on the first auxiliary layer in the second region.

In an exemplary embodiment, the first auxiliary layer may be disposed in the third region.

In an exemplary embodiment, the third electrode may not be disposed in the first region and the second region.

In an exemplary embodiment, the third electrode may also be disposed in the first region and the second region, and a thickness of a portion of the third electrode disposed in the first region or the second region may be less than a thickness of a portion of the third electrode disposed in the third region.

In an exemplary embodiment, the third electrode may be disposed on the second auxiliary layer in the first region and the second region.

In an exemplary embodiment, a thickness of the third electrode may be greater than a thickness of the second electrode.

In an exemplary embodiment, adhesion of the second electrode to the organic emission layer may be higher than adhesion of the second electrode to the first auxiliary layer.

In an exemplary embodiment, adhesion of the third electrode to the second electrode may be higher than adhesion of the third electrode to the second auxiliary layer.

In an exemplary embodiment, at least one of the first auxiliary layer and the second auxiliary layer may include N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, 4,4,4-tris(3-methylphenylphenylamino)triphenylamine (m-MTDATA), N,N'-bis(1-naphthyl)-N,N'-diphenyl[1,1'-biphenyl]-4,4'-diamine, or 4,4'-Bis[N-(3-methylphenyl)-N-phenylamino]biphenyl.

In an exemplary embodiment, the second electrode and the third electrode may include magnesium (Mg).

In an exemplary embodiment, the organic light-emitting display apparatus may further include a plurality of first lines which extends substantially in a first direction and are electrically connected to the first electrodes, respectively; and a plurality of second lines which extends substantially in a second direction, which is perpendicular to the first direction, and are electrically connected to the first electrodes, respectively, where the first auxiliary layer is disposed substantially along a straight line parallel to the first line.

In an exemplary embodiment, the second electrode may be included in a straight line parallel to the first lines.

In an exemplary embodiment, the second auxiliary layer may be disposed substantially along a straight line parallel to the second lines.

In an exemplary embodiment, the third electrode may be disposed substantially along a straight line parallel to the second lines.

According to one or more embodiments of the invention, a method of manufacturing an organic light-emitting display apparatus includes: defining a plurality of pixels on a substrate, where each pixel includes a first region including a light-emitting region which emits light, and a second region including a transmission region, which transmits external light; providing a plurality of first electrodes in the pixels, respectively, where each first electrode is disposed in the first region of a corresponding pixel; providing an organic emission layer to cover the first electrodes; providing a first auxiliary layer on the organic emission layer in the second region and to expose the first region; providing a second electrode in the first region by depositing a metal for forming the second electrode on the organic emission layer; providing a second auxiliary layer to cover the second electrode in the first region and the second region, and to expose a third region which is defined between the pixels; and providing a third electrode in the third region to be in contact with the second electrode by depositing a metal for forming the third electrode on the second electrode.

In an exemplary embodiment, the providing the second electrode may include simultaneously depositing the metal for forming the second electrode in the first region to the third region, where the second electrode exposes the second region.

In an exemplary embodiment, the providing the second electrode may include simultaneously depositing the metal for forming the second electrode in the first region to the third region, where the second electrode is provided in the second region, and a thickness of a portion of the second electrode disposed in the second region may be less than a thickness of a portion of the second electrode disposed in the first region.

In an exemplary embodiment, the providing the second electrode may include providing the second electrode on the first auxiliary layer in the second region.

In an exemplary embodiment, the providing the first auxiliary layer may include disposing the first auxiliary layer in the third region.

In an exemplary embodiment, the providing the third electrode may include simultaneously depositing the metal for forming the third electrode in the first region to the third region, where the third electrode exposes the third electrode in the first region and the second region.

In an exemplary embodiment, the providing the third electrode may include simultaneously depositing the metal for forming the third electrode in the first region to the third region, where the third electrode is provided in the first region and the second region, and a thickness of a portion of the third electrode disposed in the first region or the second region may be less than a thickness of a portion of the third electrode disposed in the third region.

In an exemplary embodiment, the providing the third electrode may include providing the third electrode on the second auxiliary layer in the first region and the second region.

In an exemplary embodiment, the third electrode may be thicker than the second electrode.

In an exemplary embodiment, adhesion of the second electrode to the organic emission layer may be higher than adhesion of the second electrode to the first auxiliary layer.

In an exemplary embodiment, adhesion of the third electrode to the second electrode may be higher than adhesion of the third electrode to the second auxiliary layer.

In an exemplary embodiment, at least one of the first auxiliary layer and the second auxiliary layer may include N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, 4,4,4-tris(3-methylphenylphenylamino)triphenylamine (m-MTDATA), N,N'-bis(1-naphthyl)-N,N'-diphenyl[1,1'-biphenyl]-4,4'-diamine, or 4,4'-Bis[N-(3-methylphenyl)-N-phenylamino]biphenyl.

In an exemplary embodiment, the metal for forming the second electrode and the metal for forming the third electrode may include magnesium (Mg).

In an exemplary embodiment, the method may further include providing a plurality of first lines which extends substantially in a first direction and are electrically connected to the first electrodes, respectively; and providing a plurality of second lines which extends substantially in a second direction, which is perpendicular to the first direction, and are electrically connected to the first electrodes, respectively, where the providing the first auxiliary layer includes patterning the first auxiliary layer to be provided substantially along a straight line parallel to the first line.

In an exemplary embodiment, the providing the second auxiliary layer may include patterning the second auxiliary layer to be provided substantially along a straight line parallel to the second lines.

According to exemplary embodiments of the invention, the second electrode and the third electrode that include metal may be provided by patterning without using a separate patterning mask, a process of providing the second and third electrodes is substantially simplified. In such embodiments, the second electrode and the third electrode expose the second region including the transmission region, and thus, transmittance of the entire panel may be substantially improved.

In such embodiments, the third electrode may reduce resistance of the second electrode.

In such embodiments, the organic light-emitting display apparatus may be a large-sized display apparatus.

BRIEF DESCRIPTION OF THE DRAWINGS

These and/or other features of the invention will become more apparent by describing in further detail exemplary embodiments thereof with reference to the accompanying drawings, in which.

DETAILED DESCRIPTION

Figure 1:
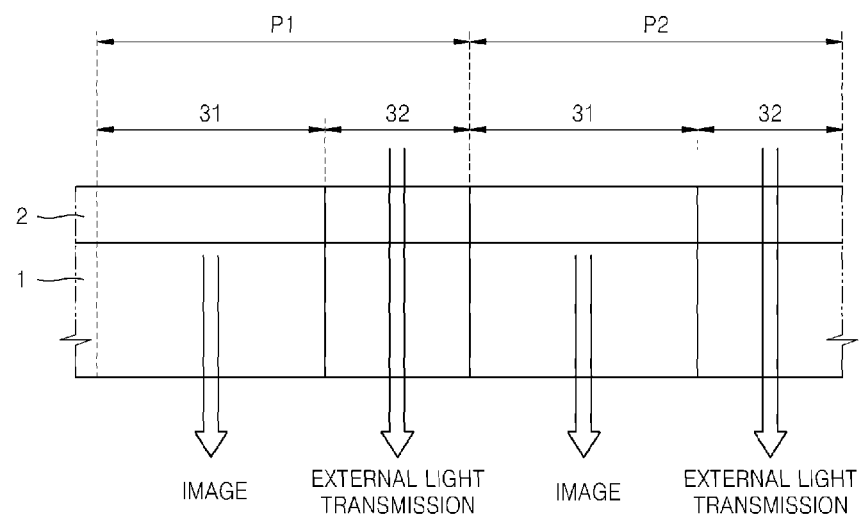
FIG. 1 is a schematic cross-sectional view of an exemplary embodiment of an organic light-emitting display apparatus.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in more detail with reference to accompanying drawings.

Figure 2:
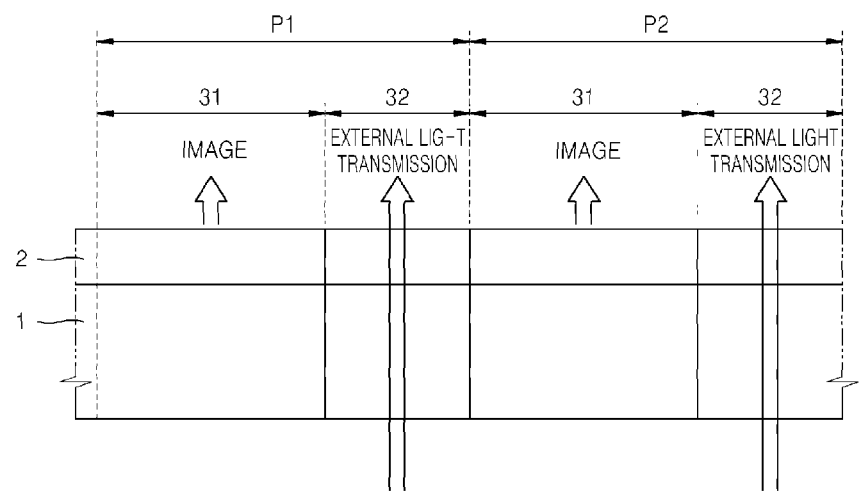
FIG. 2 is a schematic cross-sectional view of an alternative exemplary embodiment of an organic light-emitting display apparatus.
Figure 3:
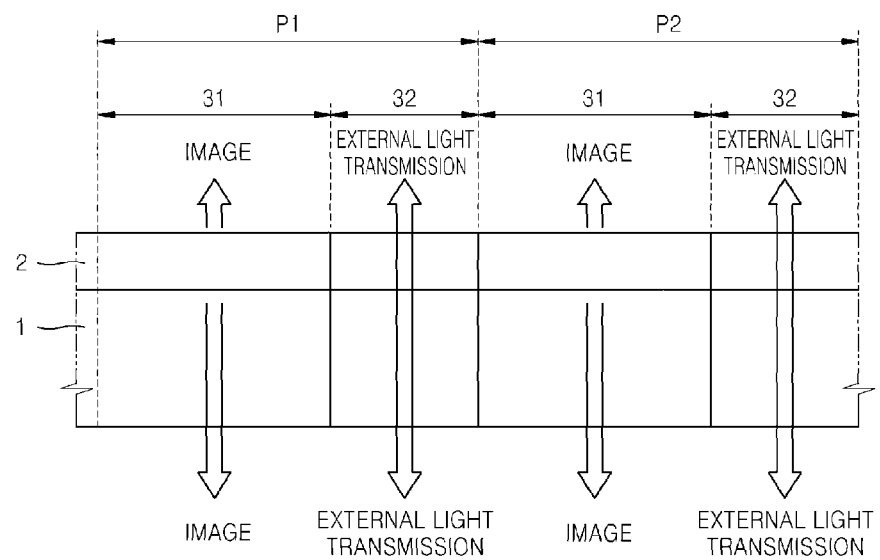
FIG. 3 is a schematic cross-sectional view of another alternative exemplary embodiment of an organic light-emitting display apparatus.

FIG. 1 is a schematic cross-sectional view of an exemplary embodiment of an organic light-emitting display apparatus according to the invention, FIG. 2 is a schematic cross-sectional view of an alternative exemplary embodiment of an organic light-emitting display apparatus, and FIG. 3 is a schematic cross-sectional view of another alternative exemplary embodiment of an organic light-emitting display apparatus.

Referring to FIG. 1, an exemplary embodiment of the organic light-emitting display apparatus includes a display unit 2 on a substrate 1.

In such an embodiment of the organic light-emitting display apparatus, external light may transmit the substrate 1 and the display unit 2.

In such an embodiment, where the organic light-emitting display apparatus include the display unit 2 that allows the external light to transmit therethrough, a user may observe an image from the outside under the substrate 1 as illustrated in FIG. 1.

FIG. 1 illustrates a first pixel P1 and a second pixel P2 that are two adjacent pixels of the organic light-emitting display apparatus.

Each of the pixels P1 and P2 includes a first region 31 and a second region 32.

An image is displayed from the display unit 2 through the first region 31, and the external light transmits through the second region 32.

In an exemplary embodiment of the invention, all of the each of the pixels P1 and P2 include the first region 31 for displaying the image and the second region 32, through which the external light transmits, such that a transmitted external image may be observed by the user when the image is not displayed by the organic light-emitting display apparatus.

In such an embodiment, devices, such as a thin film transistor, a capacitor and an organic light-emitting device, may not be provided in the second region 32, transmittance of the external light may be maximized and the occurrence of distortion of the transmitted image due to the interference by the devices, such as the thin film transistor, the capacitor and the organic light-emitting device, may be substantially reduced.

In an exemplary embodiment, the organic light-emitting display apparatus may be a bottom-emission type, in which the image of the display unit 2 is displayed in a direction of the substrate 1, as illustrated in FIG. 1. However, embodiments of the invention are not limited thereto. In an alternative exemplary embodiment, as illustrated in FIG. 2, the organic light-emitting display apparatus may be a top-emission type, in which the image of the display unit 2 is displayed in a direction opposite to the substrate 1. In another alternative exemplary embodiment, as illustrated in FIG. 3, the organic light-emitting display apparatus may be a dual-emission type, in which the image of the display unit 2 is displayed in the direction of the substrate 1 and the direction opposite to the substrate 1.

Hereinafter, an exemplary embodiment of the organic light-emitting display apparatus will be described in greater detail with reference to FIGS. 4 and 5.

Figure 4:
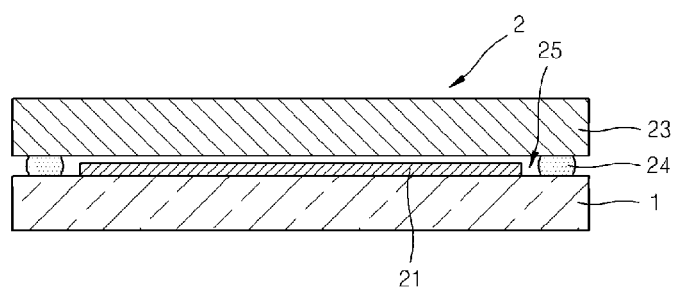
FIG. 4 is a cross-sectional view of an exemplary embodiment of an organic light-emitting display apparatus.
Figure 5:
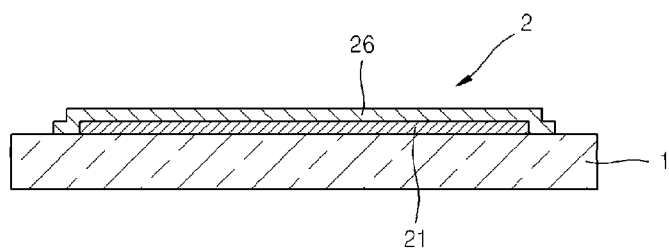
FIG. 5 is a cross-sectional view of an alternative exemplary embodiment of an organic light-emitting display apparatus.

FIG. 4 is a cross-sectional view of an exemplary embodiment of an organic light-emitting display apparatus, and FIG. 5 is a cross-sectional view of an alternative exemplary embodiment of an organic light-emitting display apparatus.

Referring to FIG. 4, the display unit 2 includes an organic light-emitting unit 21 disposed on a substrate 1, which is transparent, and a sealing substrate 23 that seals the organic light-emitting unit 21.

The sealing substrate 23 may block the penetration of the outside air and moisture into the organic light-emitting unit 21. In an exemplary embodiment, where the image of the display unit 2 is displayed in the direction opposite to the substrate 1 as shown in FIGS. 2 and 3, the sealing substrate 23 may include a transparent material such that an image displayed from the organic light-emitting unit 21 may transmit therethrough.

In an exemplary embodiment, as shown in FIG. 4, edges of the substrate 1 and the sealing substrate 23 are bonded to each other by a sealant 24 disposed therebetween such that a space 25 between the substrate 1 and the sealing substrate 23 is sealed. In such an embodiment, an absorbent or filler may be disposed in the space 25.

In an alternative exemplary embodiment, as illustrated in FIG. 5, an organic light-emitting unit 21 may be protected from the outside air by forming a thin sealing film 26 on the organic light-emitting unit 21. The sealing film 26 may have a structure in which a first layer including an inorganic material, such as silicon oxide or silicon nitride, and a second layer including an organic material, such as epoxy or polyimide, are alternatingly and repeatedly stacked on one another. However, embodiments of the invention are not limited thereto, and any sealing structure on a transparent thin film may be used.

Figure 6:
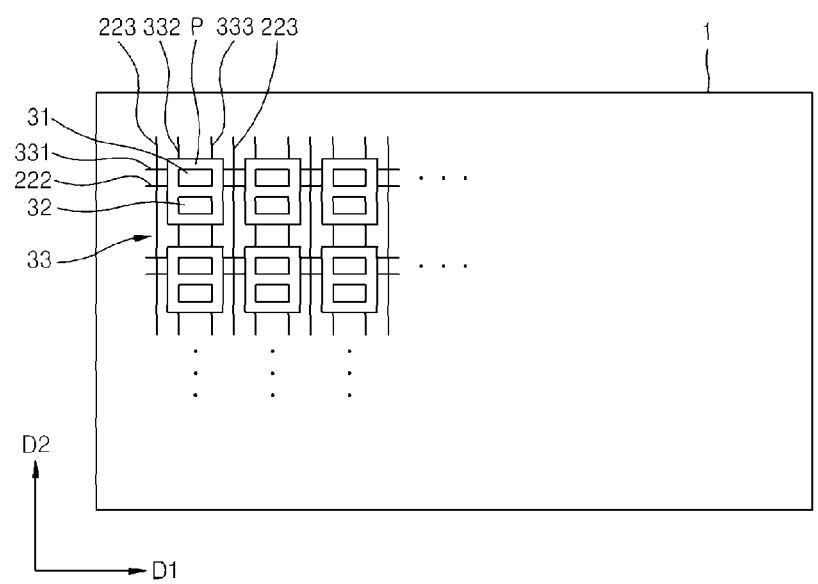
FIG. 6 is a schematic plan view of an exemplary embodiment of an organic light-emitting display apparatus according to the invention.
Figure 7:
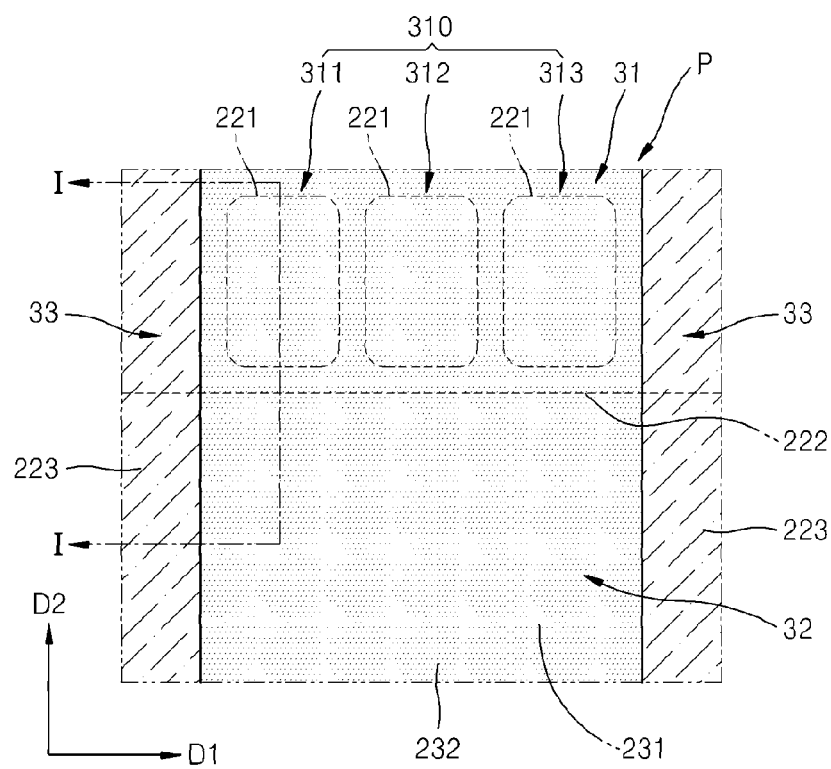
FIG. 7 is a plan view of a single pixel of FIG. 6.
Figure 8:
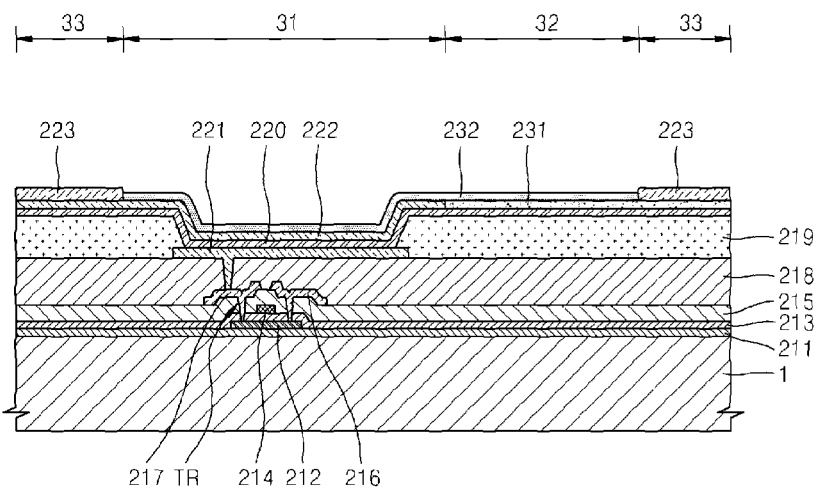
FIG. 8 is a cross-sectional view taken alone line I-I of FIG. 7.

FIG. 6 is a schematic plan view of an exemplary embodiment of an organic light-emitting display, illustrating a plurality of pixels P arranged on a substrate 1, FIG. 7 is a plan view of a single pixel P of FIG. 6, and FIG. 8 is a cross-sectional view taken alone line I-I of FIG. 7.

In an exemplary embodiment, as illustrated in FIG. 6, the substrate 1 may have the shape of a rectangle with sides extending along a first direction D1 and a second direction D2 that are substantially perpendicular to each other. In such an embodiment, the sides parallel to the first direction D1 may be longer than the sides parallel to the second direction D2.

A plurality of first lines 331, which are wirings extending substantially in the first direction D1, and a plurality of second lines 332 and third lines 333, which are wirings extending substantially in the second direction D2, may be arranged on the substrate 1. The first lines 331 to the third lines 333 may be electrically connected to each pixel P and may be electrically connected to a pixel circuit unit (not shown in FIG. 6) disposed in each pixel P. The pixel circuit unit of each pixel P may include a plurality of thin film transistors and a storage capacitor. Each pixel circuit unit is electrically connected to a first electrode, which will be described later in detail. Therefore, the first lines 331 to the third lines 333 may be electrically connected to the first electrode which is a pixel electrode of each pixel P. According to an exemplary embodiment of the invention, the first line 331 may be a scan line, the second line 332 may be a data line, and the third line 333 may be a power voltage line. However, embodiments of the invention are not limited thereto. Any one of the first line 331 to the third line 333 may be the scan line, another one may be the data line, and the other one may be the power voltage line.

Each pixel P includes a first region 31 and a second region 32. A third region 33 is disposed between the pixels P.

According to an exemplary embodiment of the invention, as illustrated in FIG. 6, a second electrode 222, which applies a common power to each pixel P, may be disposed along a substantially straight line extending in a direction parallel to the first line 331.

A third electrode 223 is disposed in the third region 33. In an exemplary embodiment, as illustrated in FIG. 6, the third electrode 223 may be disposed along a substantially straight line extending in a direction parallel to the second line 332.

The third electrode 223 is in contact with the second electrode 222. In such an embodiment, the third electrode 223 includes a conductive metal, and the third electrode 223 may function as an auxiliary electrode that reduces resistance of the second electrode 222.

In such an embodiment, as illustrated in FIG. 7, the first region 31 of each pixel P may include a light-emitting region 310, from which light is emitted. In such an embodiment of the invention, the light-emitting region 310 may include a first light-emitting region 311, a second light-emitting region 312 and a third light-emitting region 313. The first light-emitting region 311, the second light-emitting region 312 and the third light-emitting region 313 may correspond to a red sub-pixel, a green sub-pixel and a blue sub-pixel, respectively.

First electrodes 221 are each independently disposed in the first light-emitting region 311, the second light-emitting region 312 and the third light-emitting region 313.

In an exemplary embodiment, pixel circuit units (not shown), which are electrically connected to the first electrodes 221 respectively, may be disposed in the first region 31 of each pixel P, where the pixel circuit units may be disposed to overlap the light-emitting region 310 or may expose the light-emitting region 310. The second region 32, including a transmission region that is transmitted by the external light, is disposed adjacent to the first region 31. In an exemplary embodiment, as shown in FIG. 7, the transmission region and the second region 32 are substantially the same as each other. However, embodiments of the invention are not limited thereto. In an alternative exemplary embodiment, the second region 32 may be wider than the transmission region to thus include the transmission region.

In an exemplary embodiment, the second region 32 may extent across the first light-emitting region 311, the second light-emitting region 312 and the third light-emitting region 313. In such an embodiment, the single pixel P includes a red sub-pixel, a green sub-pixel and a blue sub-pixel, and the single second region 32 may be disposed adjacent to the red sub-pixel, the green sub-pixel and the blue sub-pixel. In such an embodiment, an area of the second region 32, through which the external light transmits, may be increased such that transmittance of the entire display unit 2 may be increased.

However, embodiments of the invention are not limited thereto. In an alternative exemplary embodiment, the second region 32 may be independently disposed in the first light-emitting region 311, the second light-emitting region 312 or the third light-emitting region 313.

The pixel circuit unit may include a thin film transistor TR as illustrated in FIG. 8. In an exemplary embodiment, the pixel circuit unit may include more than one thin film transistor TR. In one exemplary embodiment, for example, a plurality of thin film transistors and a storage capacitor, in addition to the thin film transistor TR shown in FIG. 8, may be further included in the pixel circuit unit.

Organic light-emitting devices are respectively disposed in the first light-emitting region 311, the second light-emitting region 312 and the third light-emitting region 313. The organic light-emitting devices are electrically connected to the thin film transistor TR of the pixel circuit unit.

In an exemplary embodiment, as illustrated in FIG. 8, a buffer layer 211 is disposed on the substrate 1, and the pixel circuit unit, including the thin film transistor TR, is disposed on the buffer layer 211.

In such an embodiment, a semiconductor active layer 212 is disposed on the buffer layer 211.

The buffer layer 211 may include a transparent insulating material, and may function to effectively prevent the penetration of impurity elements and planarize a surface of the substrate 1. The buffer layer 211 may include various materials that may perform the functions described above. In one exemplary embodiment, for example, the buffer layer 211 may include an inorganic material, such as silicon oxide, silicon nitride, silicon oxynitride, aluminum oxide, aluminum nitride, titanium oxide and titanium nitride, an organic material, such as polyimide, polyester and acryl, or a combination thereof. In an alternative exemplary embodiment, the buffer layer 211 may be omitted.

In an exemplary embodiment, the semiconductor active layer 212 may include polysilicon, for example. In an alternative exemplary embodiment, the semiconductor active layer 212 may include an oxide semiconductor. In one exemplary embodiment, for example, the semiconductor active layer 212 may include a indium gallium zinc oxide ("IGZO"), e.g., $(In_2O_3)_a(Ga_2O_3)_b(ZnO)_c$ (where a, b and c are real numbers satisfying the following inequation: a≥0, b≥0 and c>0).

A gate insulating layer 213 is disposed on the buffer layer 211 to cover the semiconductor active layer 212, and a gate electrode 214 is disposed on the gate insulating layer 213.

An interlayer insulating layer 215 is disposed on the gate insulating layer 213 to cover the gate electrode 214, and a source electrode 216 and a drain electrode 217 are disposed on the interlayer insulating layer 215 to be in contact with the semiconductor active layer 212 through contact holes defined, e.g., formed, in the interlayer insulating layer 215.

A structure of the thin film transistor TR of an exemplary embodiment is not limited to the structure shown in FIG. 8, and various types of structures of thin film transistors may be used.

A first insulating layer 218 is disposed on the interlayer insulating layer 215 to cover the thin film transistor TR. The first insulating layer 218 may have a single-layer structure or a multi-layer structure, in which a top surface thereof is planarized. The first insulating layer 218 may include an inorganic material and/or an organic material.

In such an embodiment, as illustrated in FIG. 8, a first electrode 221 of the organic light-emitting device electrically connected to the thin film transistor TR is disposed on the first insulating layer 218. The first electrode 221 may be in the shape of an island.

A second insulating layer 219 is disposed on the first insulating layer 218 to cover edges of the first electrode 221. The second insulating layer 219 may include an organic material, such as acryl and polyimide, for example.

An organic emission layer 220 is disposed on the first electrode 221, and a second electrode 222 is disposed to cover the organic emission layer 220 to thereby define an organic light-emitting device.

In such an embodiment, the organic emission layer 220 may include a low molecular weight organic material or a polymer organic material, for example In an exemplary embodiment, where the organic emission layer 220 includes a low molecular weight organic material, the organic emission layer 220 may include a hole injection layer ("HIL"), a hole transport layer ("HTL"), an emission layer ("EML"), an electron transport layer ("ETL") and an electron injection layer ("EIL"), which are stacked in a single or composite structure. In such an embodiment, the organic emission layer 220 including low molecular weight organic material layers may be provided, e.g., formed, by vacuum deposition.

The EML may be independently provided for each of the red, green and blue sub-pixels, e.g., in the first light-emitting region 311, the second light-emitting region 312 and the third light-emitting region 313, and the HIL, the HTL, the ETL and the EIL may be commonly provided in the first light-emitting region 311, the second light-emitting region 312 and the third light-emitting region 313 as common layers. In an exemplary embodiment, as shown in FIG. 7, a red emission layer may be formed substantially in a straight line parallel to the second direction D2 to pass the first light-emitting region 311, a green emission layer may be formed substantially in a straight line parallel to the second direction D2 to pass the second light-emitting region 312, and a blue emission layer may be formed substantially in a straight line parallel to the second direction D2 to pass the third light-emitting region 313. IN such an embodiment, the above-described common layers, e.g., the HIL, the HTL, the ETL and the EIL, may be formed to cover the entire pixels P using an open mask.

However, embodiments of the invention are not necessarily limited thereto, and various modified embodiments may be used. In one alternative exemplary embodiment, for example, the red emission layer, the green emission layer and the blue emission layer may be formed in a dot pattern to respectively correspond to the first light-emitting region 311, the second light-emitting region 312 and the third light-emitting region 313. In another alternative exemplary embodiment, the blue emission layer is commonly formed in the first light-emitting region 311, the second light-emitting region 312 and the third light-emitting region 313, and the red emission layer and the green emission layer may be respectively formed in a dot pattern in the first light-emitting region 311 and the second light-emitting region 312 or may be formed substantially in a straight line pattern parallel to the second direction D2 to pass the first light-emitting region 311 and the second light-emitting region 312. In an exemplary embodiment, at least one of the common layers may be patterned in the same manner as each emission layer.

The HIL may include a phthalocyanine compound, such as copper phthalocyanine, starburst-type amines, such as tris(4-carbazoyl-9-ylphenyl)amine ("TCTA"), 4,4',4"-tris(N-3-methylphenyl-N-phenylamino)triphenylamine ("m-MT- DATA"), and 1,3,5-tris[4-(3-methylphenylphenylamino) phenyl]benzene ("m-MTDAPB"), for example, or a combination thereof.

The HTL may include N,N'-bis(3-methylphenyl)-N,N'-diphenyl-(1,1-biphenyl)-4,4'-diamine ("TPD"), N,N'-di (naphthalene-1-yl)-N,N'-diphenylbenzidine ("α-NPD") or a combination thereof.

The EIL may include a material, such as LiF, NaCl, CsF, $Li_2O$, BaO or 8-hydroxyquinolinolato-lithium ("Liq").

The ETL may include tris(8-hydroxyquinolinato)aluminum ("Alq3").

The EML may include a host material and a dopant material.

The host material of the EML may include Alq3, 9,10-di (naphth-2-yl)anthracene ("ADN"), 2-tertbutyl-9,10-di (naphth-2-yl)anthracene ("TBADN"), 4,4'-bis(2,2-diphenylethene-1-yl)biphenyl ("DPVBi"), or 4,4'-bis(2,2-di(4-methylphenyl)-ethene-1-yl)biphenyl ("p-DMDPVBi").

The dopant material of the EML may include 4,4'-bis[4-(di-p-tolylamino)styryl]biphenyl ("DPAVBi"), ADN, or TBADN.

In an exemplary embodiment, the first electrode 221 may function as an anode and the second electrode 222 may function as a cathode, but is not limited thereto. In an alternative exemplary embodiment, the first electrode 221 may function as a cathode, and the second electrode 222 may function as an anode in an alternative exemplary embodiment.

In an exemplary embodiment, where the first electrode 221 functions as an anode, the first electrode 221 may include a high work function material, such as indium tin oxide ("ITO"), indium zinc oxide ("IZO"), zinc oxide (ZnO) and indium oxide ($In_2O_3$). In an exemplary embodiment, where the organic light-emitting display is a top-emission type in which an image is obtained in a direction opposite to the substrate 1, the first electrode 221 may further include a reflective layer (not shown) including silver (Ag), magnesium (Mg), aluminium (Al), platinum (Pt), palladium (Pd), gold (Au), nickel (Ni), neodymium (Nd), iridium (Ir), chromium (Cr), lithium (Li), ytterbium (Yb), cobalt (Co), samarium (Sm), calcium (Ca), or a combination thereof.

In an exemplary embodiment, where the second electrode 222 functions as a cathode, the second electrode 222 may include a metal, such as Ag, Mg, Al, Pt, Pd, Au, Ni, Nd, Ir, Cr, Li, Yb, Co, Sm, or Ca, for example. In an exemplary embodiment, where the organic light-emitting display is a top-emission type, the second electrode 222 may be transparent and/or semi-transparent to light. In such an embodiment, the second electrode 222 may be provided as a thin film including Mg and/or a Mg alloy. The second electrode 222 may function as a common electrode to apply a common voltage to the pixels.

In an exemplary embodiment, where the second electrode 222 functions as the common electrode that applies the common voltage to all pixels, a voltage drop phenomenon may occur when the sheet resistance of the second electrode 222 increases.

In such an embodiment, a third electrode 223 may be further provided to be electrically connected to the second electrode 222 to effectively prevent the voltage drop phenomenon. The third electrode 223 may include a metal, such as Ag, Mg, Al, Pt, Pd, Au, Ni, Nd, Ir, Cr, Li, Yb, Co, Sm, or Ca, and may include a same material as the second electrode 222.

According to an exemplary embodiment, as illustrated in FIG. 8, after providing the organic emission layer 220 and before providing the second electrode 222, a first auxiliary layer 231 may be provided, e.g., formed, in the second region 32 on the organic emission layer 220. In such an embodiment, the first auxiliary layer 231 may be deposited using a mask (not shown), and the first auxiliary layer 231 may be provided in the second region 32 and may not be provided in the first region 31. The first auxiliary layer 231 may be formed in a portion of the third region 33. In an exemplary embodiment, where the first auxiliary layer 231 is formed in a straight line parallel to the first direction D1 as shown in FIG. 7, the first auxiliary layer 231 may be provided in a portion of the third region 33 that is adjacent to the second region 32. However, embodiments of the invention are not limited thereto. The first auxiliary layer 231 may be patterned to expose the third region 33.

The first auxiliary layer 231 may include a material having low adhesion to a material of a layer thereon, i.e., the material of the second electrode 222, e.g., Mg and/or a Mg alloy.

In one exemplary embodiment, for example, the first auxiliary layer 231 may include N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl) anthracene-2-yl)phenyl)-1-phenyl-1H-benzo-[D]imidazole, m-MTDATA, α-NPD, or TPD.

The first auxiliary layer 231, which is patterned to be disposed in the second region 32 and not to be disposed in the first region 31, is provided on the organic emission layer 220, before providing the second electrode 222.

In an exemplary embodiment, the second electrode 222 may be provided by commonly depositing a metal for forming the second electrode 222 over the entire pixels including the first region 31 to the third region 33 using an open mask. In such an embodiment, as described above, the second electrode 222 may be formed as a thin film such that the second electrode 222 may become a transflective layer or a transparent layer.

In such an embodiment, where the metal for forming the second electrode 222 is commonly deposited over the entire pixels using the open mask, the metal for forming the second electrode 222 may not be well deposited on the first auxiliary layer 231, but may be well deposited on the organic emission layer 220. In such an embodiment, where the organic emission layer 220 is patterned as described above, the metal for forming the second electrode 222 may also be deposited on the second insulating layer 219 on which the first auxiliary layer 231 is not provided.

In such an embodiment, where the metal for forming the second electrode 222 may not be well deposited on the first auxiliary layer 231 but may be well deposited on the organic emission layer 220, the second electrode 222 may have a patterned shape that exposes the second region 32 including the transmission region.

In such an embodiment, adhesion of the second electrode 222 to the organic emission layer 220 is higher than adhesion of the second electrode 222 to the first auxiliary layer 231, and the second electrode 222 is formed as a thin film, such that the second electrode 222 is provided in a region of the first region 31 and the third region 33, in which the first auxiliary layer 231 is not provided, but is not provided in a region of the second region 32 and the third region 33, in which the first auxiliary layer 231 is provided.

Therefore, in such an embodiment, the second electrode 222 may be efficiently patterned without using a separate mask for patterning.

In such an embodiment, the second insulating layer 219 and/or the common layer may include a material having higher adhesion to the metal for forming the second electrode 222 than the first auxiliary layer 231. In one exemplary embodiment, for example, the second insulating layer 219 may include acryl, and the common layer, e.g., the EIL, may include Liq.

Next, a second auxiliary layer 232 is provided in the first region 31 and the second region 32. The second auxiliary layer 232 is provided on the second electrode 222 in the first region 31 and is provided on the first auxiliary layer 231 in the second region 32. The second auxiliary layer 232 may be patterned to expose the third region 33.

The second auxiliary layer 232 may include a material having low adhesion to a material of a layer thereon, i.e., the metal of the third electrode 223, e.g., Mg and/or a Mg alloy.

The second auxiliary layer 232 may include N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, m-MTDATA, α-NPD, or TPD.

In an exemplary embodiment, the second auxiliary layer 232 may function as a mask when the third electrode 223 is provided.

In such an embodiment, the metal for forming the third electrode 223 may be commonly deposited over the first region 31 to the third region 33 using an open mask after providing the second auxiliary layer 232, the third electrode 223 may not be deposited in the first region 31 and the second region 32, but may be only provided in the third region 33 such that the second auxiliary layer 232 is formed in the first region 31 and the second region 32.

The third electrode 223 may be thicker than the second electrode 222, and as a result, the voltage drop of the second electrode 222, which applies a common voltage, may be effectively prevented.

In such an embodiment as described above, since the second electrode 222 and the third electrode 223 including metal may be provided by patterning without using a fine metal mask such that the process of providing the second electrode 222 and the third electrode 223 may be substantially simplified. In such an embodiment, the second electrode 222 and the third electrode 223 are not allowed to be formed in the second region 32 including the transmission region, and thus, transmittance of the entire panel is substantially improved.

The organic emission layer 220, the first auxiliary layer 231 and the second auxiliary layer 232 may use a material having high optical transmittance in a state in which power is not applied thereto. Accordingly, transmittance of external light in the second region 32 may is effectively prevented from being reduced.

Figure 9:
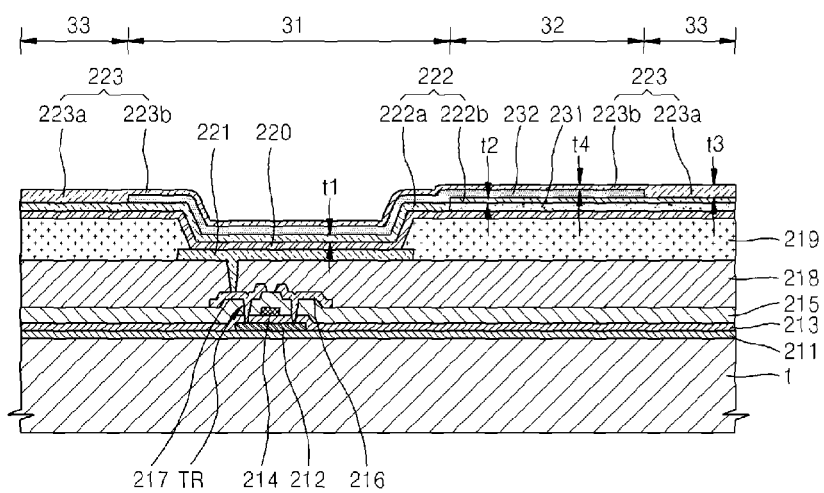
FIG. 9 is a cross-sectional view of an alternative exemplary embodiment of an organic light-emitting display apparatus according to the invention.

FIG. 9 is a cross-sectional view of an alternative exemplary embodiment of an organic light-emitting display apparatus according to the invention.

The organic light-emitting display apparatus in FIG. 9 is substantially the same as the organic light-emitting display apparatus shown in FIG. 8 except for the second electrode 222 and the second auxiliary layer 223. The same or like elements shown in FIG. 9 have been labeled with the same reference characters as used above to describe the exemplary embodiment of organic light-emitting display apparatus shown in FIG. 8, and any repetitive detailed description thereof will hereinafter be omitted or simplified.

In an exemplary embodiment, where the first auxiliary layer 231 and/or the second auxiliary layer 232 include a material having low adhesion to a metal of a layer thereon, e.g., Mg and/or a Mg alloy, a small amount of the metal may be deposited on the first auxiliary layer 231 and/or the second auxiliary layer 232.

Therefore, in such an embodiment where the first auxiliary layer 231 is formed in the second region 32 and a portion of the third region 33 and is not formed in the first region 31 and another portion of the third region 33, when the metal for forming the second electrode 222 is deposited in the first region 31 to the third region 33 using an open mask as described above, the second electrode 222 may be entirely provided in the first region 31 to the third region 33 as illustrated in FIG. 9. when the second electrode 222 may be entirely provided in the first region 31 to the third region 33, a thickness t2 of a portion 222b of the second electrode 222 that is disposed in the second region 32 and the portion of the third region 33 may be relatively less than a thickness t1 of a portion 222a of the second electrode 222 that is disposed in the first region 31 and the another portion of the third region 33.

In such an embodiment, where the second auxiliary layer 232 is formed in the first region 31 and the second region 32 and is not formed in the third region 33, when the metal for forming the third electrode 223 is deposited in the first region 31 to the third region 33 using an open mask as described above, the third electrode 223 may be entirely formed in the first region 31 to the third region 33 as illustrated in FIG. 9. When the third electrode 223 may be entirely formed in the first region 31 to the third region 33, a thickness t4 of a portion 223b of the third electrode 223 that is disposed in the first region 31 and the second region 32 may be relatively less than a thickness t3 of a portion 223a of the third electrode 223 that is disposed in the third region 33.

In such an embodiment, as shown in FIG. 9, the portion 222b of the second electrode 222 and the portion 223b of the third electrode 223, which includes a metallic material, may be disposed in the second region 32, e.g., a transmission region. In such an embodiment, the portion 222b of the second electrode 222 and the portion 223b of the third electrode 223 are substantially thin, such that the transmittance of external light at the second region 32 may be effectively prevented from being substantially reduced.

Figure 10:
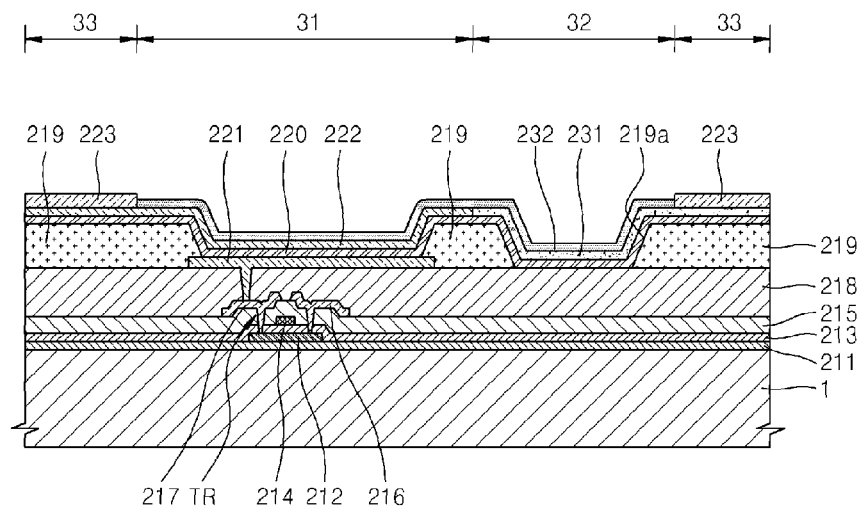
FIG. 10 is a cross-sectional view of another embodiment of an organic light-emitting display apparatus according to the invention.

FIG. 10 is a cross-sectional view of another alternative exemplary embodiment of an organic light-emitting display apparatus according to the invention.

The organic light-emitting display apparatus in FIG. 10 is substantially the same as the organic light-emitting display apparatus shown in FIG. 8 except for the second insulating layer 219. The same or like elements shown in FIG. 10 have been labeled with the same reference characters as used above to describe the exemplary embodiment of organic light-emitting display apparatus shown in FIG. 8, and any repetitive detailed description thereof will hereinafter be omitted or simplified.

In an exemplary embodiment, as shown in FIG. 10, a transmission window 219a may be defined in the second region 32 of the second insulating layer 219. The transmission window 219a may be formed by removing a portion of the second insulating layer 219 corresponding to the second region 32, such that the transmittance of external light in the second region 32 is substantially improved. FIG. 10 illustrates an exemplary embodiment where the transmission window 219a is defined only in the second insulating layer 219. However, embodiments of the invention are not limited thereto, and a transmission window may be further provided in at least one of the first insulating layer 218, the interlayer insulating layer 215, the gate insulating layer 213 and the buffer layer 211 in an alternative exemplary embodiment. A structure of the transmission window illustrated in FIG. 10 may be provided in the exemplary embodiment illustrated in FIG. 9.

Such an embodiment of an organic light-emitting display apparatus may be a large-sized organic light-emitting display apparatus. A patterning process using a fine metal mask may not be efficiently and effectively used to manufacture a large-sized organic light-emitting display apparatus such that patterning of the second electrode with respect to the second region including the transmission region may be difficult. However, in an exemplary embodiment of the invention, an open mask, instead of the fine metal mask, may be used for the patterning of the second electrode, such that patterning of the second electrode with respect to the second region including the transmission region may be effectively and efficiently performed.

Next, an exemplary embodiment of a method of manufacturing an organic light-emitting display apparatus according to the invention will be described with reference to FIGS. 11 to 14.

FIGS. 11 to 14 are plan views illustrating an exemplary embodiment of a method of manufacturing an organic light-emitting display apparatus according to the invention.

Figure 11:
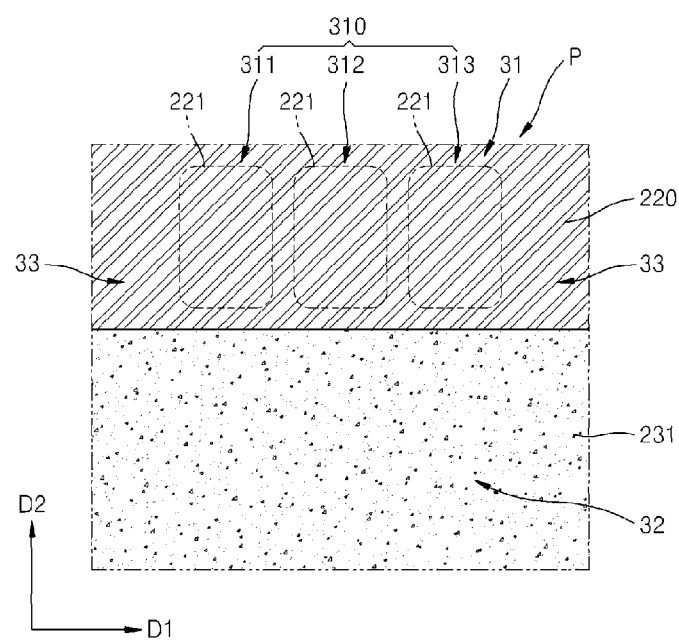
FIGS. 11 to 14 are plan views illustrating an exemplary embodiment of a method of manufacturing an organic light-emitting display apparatus according to the invention.

A substrate, in which an organic emission layer 220 is provided in each pixel P, is prepared, and a first auxiliary layer 231 is provided, e.g., formed, on the substrate as illustrated in FIG. 11.

As described above, the organic emission layer 220 may include red, green and blue EMLs, and common layers, such as a HIL, a HTL, an ETL and an EIL. The red, green and blue EMLs may be each independently patterned for a first light-emitting region 311, a second light-emitting region 312 and a third light-emitting region 313, and the common layers may be commonly provided in the first light-emitting region 311, the second light-emitting region 312 and the third light-emitting region 313.

According to an exemplary embodiment of the invention, the red EML may be provided substantially along a straight line parallel to a second direction D2 to pass the first light-emitting region 311, the green EML may be provided substantially along a straight line parallel to the second direction D2 to pass the second light-emitting region 312, and the blue EML may be provided substantially along a straight line parallel to the second direction D2 to pass the third light-emitting region 313. The common layers may be provided to cover the entire pixels P using an open mask.

However, embodiments of the invention are not limited thereto, and the organic emission layer 220 may be provided using various methods. In one alternative exemplary embodiment, for example, the red EML, the green EML and the blue EML may be formed in a dot pattern to respectively correspond to the first light-emitting region 311, the second light-emitting region 312 and the third light-emitting region 313. In such an embodiment, the blue EML is commonly formed in the first light-emitting region 311, the second light-emitting region 312 and the third light-emitting region 313, and the red EML and the green EML may be formed in a dot pattern respectively in the first light-emitting region 311 and the second light-emitting region 312 or may be formed substantially along a straight line pattern parallel to the second direction D2 to pass the first light-emitting region 311 and the second light-emitting region 312. In another alternative exemplary embodiment, at least one of the common layers may be patterned in the same manner as each EML.

The first auxiliary layer 231 may be provided, e.g., formed, in the second region 32 but not in the first region 31. The first auxiliary layer 231 may be provided in a portion of the third region 33.

According to an exemplary embodiment of the invention, the first auxiliary layer 231 may be provided substantially along a straight line parallel to a first direction D1 as illustrated in FIG. 11. Therefore, the first auxiliary layer 231 may be substantially parallel to the first line 331 (see FIG. 6).

Next, a metal for forming a second electrode 222 is commonly deposited over the entire pixels including the first region 31 to the third region 33 using an open mask. In an exemplary embodiment, the second electrode 222 may be formed as a thin film such that the second electrode 222 may become a transflective layer.

When the metal for forming the second electrode 222 is commonly deposited over the entire pixels using the open mask, the metal for forming the second electrode 222 may have low adhesion to the first auxiliary layer 231, but high adhesion to the organic emission layer 220. In such an embodiment, when the organic emission layer 220 is patterned as described above, the metal for forming the second electrode 222 may also be deposited on the second insulating layer 219 on which the first auxiliary layer 231 is not provided.

Figure 12:
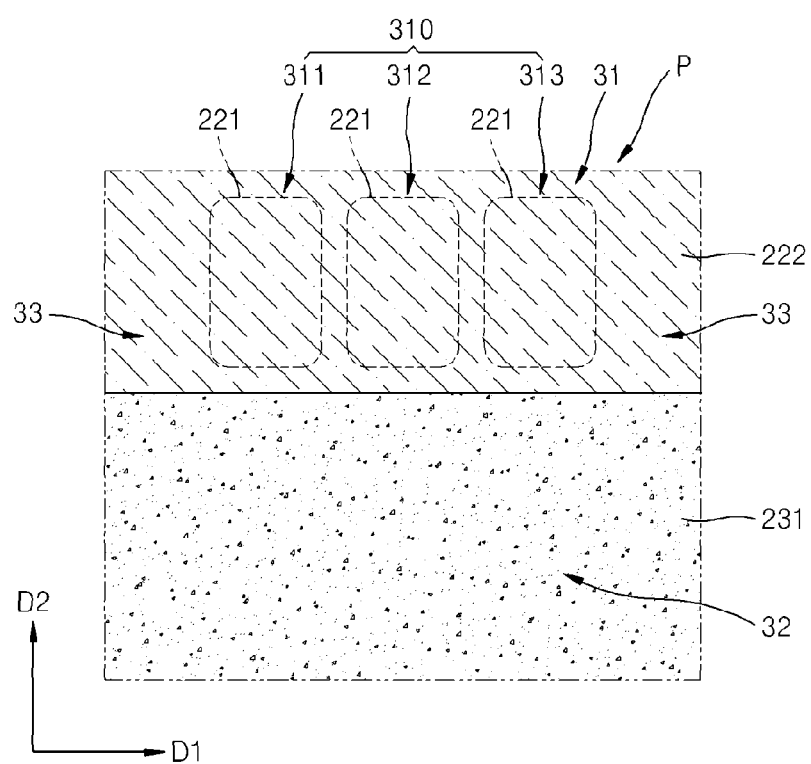

Accordingly, the second electrode 222 may be formed in a straight line parallel to the first direction D1 as illustrated in FIG. 12.

Figure 13:
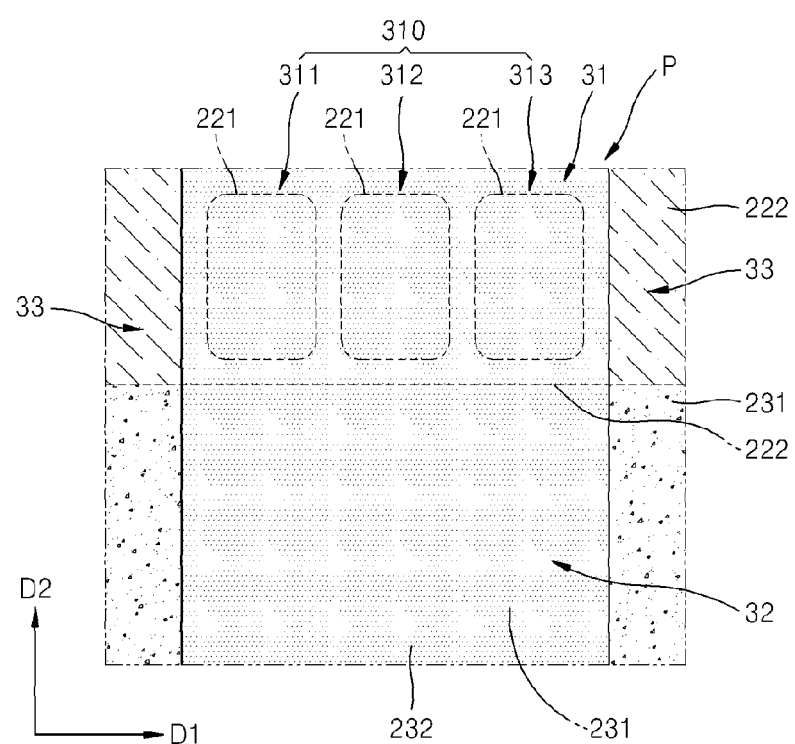

Next, as illustrated in FIG. 13, a second auxiliary layer 232 is provided, e.g., formed, in the first region 31 and the second region 32. The second auxiliary layer 232 is provided on the second electrode 222 in the first region 31 and on the first auxiliary layer 231 in the second region 32. The second auxiliary layer 232 may be patterned to expose the third region 33.

According to an exemplary embodiment of the invention, the second auxiliary layer 232 may be provided substantially along a straight line parallel to the second direction D2 as illustrated in FIG. 13. Therefore, the second auxiliary layer 232 may be substantially parallel to the second line 332 (see FIG. 6).

Figure 14:
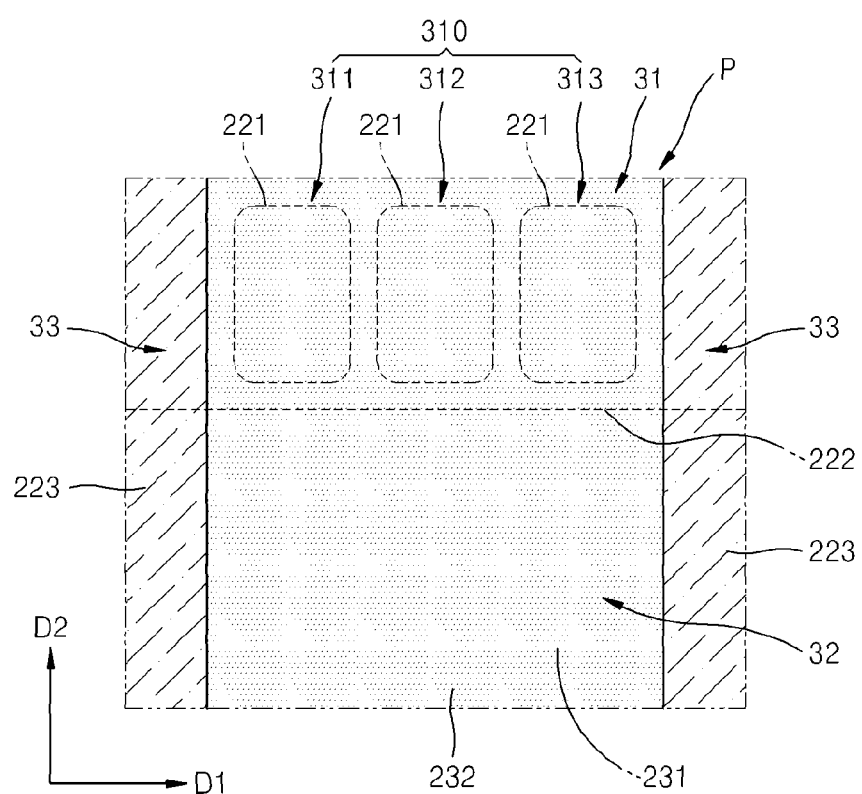

Next, a metal for forming a third electrode 223 is commonly deposited over the first region 31 to the third region 33 using an open mask. In an exemplary embodiment, the second auxiliary layer 232 may function as a mask for forming the third electrode 223. Therefore, the third electrode 223 may not effectively provided in the first region 31 and the second region 32, but may only be provided in the third region 33, and thus, the third electrode 223 may be provided substantially along a straight line parallel to the second direction D2 as illustrated in FIG. 14. As a result, the third electrode 223 may be substantially parallel to the second line 332 (see FIG. 6). The third electrode 223 may be thicker than the second electrode 222.

In such an embodiment, the second electrode 222 and the third electrode 223, which includes a metal, may be formed by patterning without using a separate mask, such that a process of providing the second electrode 222 and the third electrode 223 may be substantially simplified. In such an embodiment, the second electrode 222 and the third electrode 223 are effectively prevented from being provided in the second region 32 including the transmission region, and thus, transmittance of the entire panel may be substantially improved.

The manufacturing method shown in FIGS. 11 to 14 illustrates an exemplary embodiment of a method of manufacturing the exemplary embodiment of an organic light-emitting display apparatus illustrated in FIG. 8. However, the manufacturing method may also be used to manufacture the exemplary embodiments of an organic light-emitting display apparatus illustrated in FIGS. 9 and 10.

Figure 15:
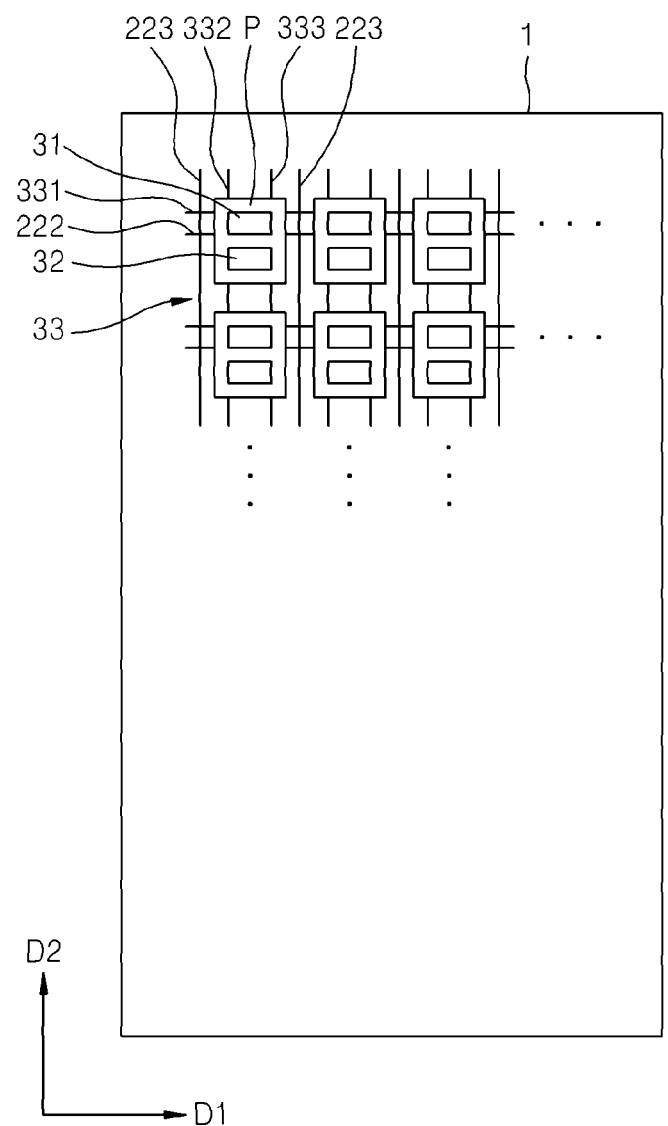
FIG. 15 is a plan view of an alternative exemplary embodiment of an organic light-emitting display apparatus according to the invention.

As illustrated in FIG. 6, exemplary embodiments of an organic light-emitting display apparatus having a structure, in which long sides of the substrate 1 extend along the first direction D1 and short sides of the substrate 1 extend along the second direction D2, are described herein. However, embodiments of the invention are not limited thereto. As illustrated in FIG. 15, an exemplary embodiment of an organic light-emitting display apparatus may have a structure, in which short sides of a substrate 1 extend along the first direction D1 and long sides of the substrate 1 extend along the second direction D2.

It should be understood that the exemplary embodiments described therein should be considered in a descriptive sense only and not for purposes of limitation. Descriptions of features or aspects within each embodiment should typically be considered as available for other similar features or aspects in other embodiments.

While the invention have been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An organic light-emitting display apparatus comprising:
    a substrate;
    a plurality of pixels defined on the substrate, wherein each pixel comprises:
        a first region comprising a light-emitting region which emits light; and
        a second region comprising a transmission region which transmits external light;
    a third region defined on the substrate disposed between the pixels;
    a plurality of first electrodes disposed in the pixels on the substrate, respectively, wherein each first electrode is disposed in the first region of a corresponding pixel;
    an organic emission layer disposed to cover the first electrodes;
    a first auxiliary layer disposed on the organic emission layer in the second region and which exposes the first region;
    a second electrode disposed on the organic emission layer in the first region;
    a second auxiliary layer disposed in the first region and the second region and which exposes the third region; and
    a third electrode disposed in the third region and in contact with the second electrode.

2. The organic light-emitting display apparatus of claim 1, wherein
    the second electrode exposes the second region.

3. The organic light-emitting display apparatus of claim 1, wherein
    the second electrode is disposed in the second region, and
    a thickness of a portion of the second electrode in the second region is less than a thickness of a portion of the second electrode in the first region.

4. The organic light-emitting display apparatus of claim 3, wherein
    the second electrode is disposed on the first auxiliary layer in the second region.

5. The organic light-emitting display apparatus of claim 1, wherein
    the first auxiliary layer is disposed in the third region.

6. The organic light-emitting display apparatus of claim 1, wherein
    the third electrode exposes the first region and the second region.

7. The organic light-emitting display apparatus of claim 1, wherein
    the third electrode is disposed in the first region and the second region, and
    a thickness of a portion of the third electrode in the first region or the second region is less than a thickness of a portion of the third electrode in the third region.

8. The organic light-emitting display apparatus of claim 7, wherein
    the third electrode is disposed on the second auxiliary layer in the first region and the second region.

9. The organic light-emitting display apparatus of claim 1, wherein
    a thickness of the third electrode is greater than a thickness of the second electrode.

10. The organic light-emitting display apparatus of claim 1, wherein
    adhesion of the second electrode to the organic emission layer is higher than adhesion of the second electrode to the first auxiliary layer.

11. The organic light-emitting display apparatus of claim 1, wherein
    adhesion of the third electrode to the second electrode is higher than adhesion of the third electrode to the second auxiliary layer.

12. The organic light-emitting display apparatus of claim 1, wherein
    at least one of the first auxiliary layer and the second auxiliary layer comprises N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, 4,4,4-tris(3-methylphenylphenylamino)triphenylamine, N,N'-bis(1-naphthyl)-N,N'-diphenyl[1,1'-biphenyl]-4,4'-diamine, or 4,4'-Bis[N-(3-methylphenyl)-N-phenylamino]biphenyl.

13. The organic light-emitting display apparatus of claim 1, wherein
    the second electrode and the third electrode comprise magnesium (Mg).

14. The organic light-emitting display apparatus of claim 1, further comprising:
    a plurality of first lines which extends substantially in a first direction and is electrically connected to the first electrodes, respectively; and
    a plurality of second lines which extends substantially in a second direction, which is perpendicular to the first direction, and is electrically connected to the first electrodes, respectively,
    wherein the first auxiliary layer is disposed substantially along a straight line parallel to the first lines.

15. The organic light-emitting display apparatus of claim 14, wherein
    the second electrode is disposed substantially along a straight line parallel to the first lines.

16. The organic light-emitting display apparatus of claim 14, wherein
    the second auxiliary layer is disposed substantially along a straight line parallel to the second lines.

17. The organic light-emitting display apparatus of claim 14, wherein
    the third electrode is disposed substantially along a straight line parallel to the second lines.

18. A method of manufacturing an organic light-emitting display apparatus, the method comprising:
- defining a plurality of pixels on a substrate, wherein each pixel comprises:
  - a first region comprising a light-emitting region which emits light; and
  - a second region comprising a transmission region, which transmits external light;
- providing a plurality of first electrodes in the pixels, respectively, wherein each first electrode is disposed in the first region of a corresponding pixel;
- providing an organic emission layer to cover the first electrodes;
- providing a first auxiliary layer on the organic emission layer in the second region and to expose the first region;
- providing a second electrode in the first region by depositing a metal for forming the second electrode on the organic emission layer;
- providing a second auxiliary layer to cover the second electrode in the first region and the second region, and to expose a third region which is defined between the pixels; and
- providing a third electrode in the third region to be in contact with the second electrode by depositing a metal for forming the third electrode on the second electrode.

19. The method of claim 18, wherein
the providing the second electrode comprises simultaneously depositing the metal for forming the second electrode in the first region to the third region, wherein the second electrode exposes the second region.

20. The method of claim 18, wherein
the providing the second electrode comprises simultaneously depositing the metal for forming the second electrode in the first region to the third region,
wherein
the second electrode is provided in the second region, and
a thickness of a portion of the second electrode in the second region is less than a thickness of a portion of the second electrode in the first region.

21. The method of claim 20, wherein
the providing the second electrode comprises providing the second electrode on the first auxiliary layer in the second region.

22. The method of claim 18, wherein
the providing the first auxiliary layer comprises disposing the first auxiliary layer in the third region.

23. The method of claim 18, wherein
the providing the third electrode comprises simultaneously depositing the metal for forming the third electrode in the first region to the third region, wherein the third electrode exposes the first region and the second region.

24. The method of claim 18, wherein
the providing the third electrode comprises simultaneously depositing the metal for forming the third electrode in the first region to the third region,
wherein the third electrode is provided in the first region and the second region, and
a thickness of a part of the third electrode in the first region or the second region is less than a thickness of a portion of the third electrode in the third region.

25. The method of claim 24, wherein
the providing the third electrode comprises providing the third electrode on the second auxiliary layer in the first region and the second region.

26. The method of claim 18, wherein
the third electrode is thicker than the second electrode.

27. The method of claim 18, wherein
adhesion of the second electrode to the organic emission layer is higher than adhesion of the second electrode to the first auxiliary layer.

28. The method of claim 18, wherein
adhesion of the third electrode to the second electrode is higher than adhesion of the third electrode to the second auxiliary layer.

29. The method of claim 18, wherein
at least one of the first auxiliary layer and the second auxiliary layer comprises N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, 4,4,4-tris(3-methylphenylphenylamino)triphenylamine, N,N'-bis(1-naphthyl)-N,N'-diphenyl[1,1'-biphenyl]-4,4'-diamine, or 4,4'-Bis[N-(3-methylphenyl)-N-phenylamino]biphenyl.

30. The method of claim 18, wherein
the metal for forming the second electrode and the metal for forming the third electrode comprise magnesium (Mg).

31. The method of claim 18, further comprising:
providing a plurality of first lines which extends substantially in a first direction and is electrically connected to the first electrodes, respectively; and
providing a plurality of second lines which extends substantially in a second direction, which is perpendicular to the first direction, and is electrically connected to the first electrodes, respectively,
wherein the providing the first auxiliary layer comprises patterning the first auxiliary layer to be provided substantially along a straight line parallel to the first lines.

32. The method of claim 31, wherein the providing the second auxiliary layer comprises patterning the second auxiliary layer to be provided substantially along a straight line parallel to the second lines.

* * * * *